United States Patent
Bloemen

(10) Patent No.: US 8,593,311 B2
(45) Date of Patent: Nov. 26, 2013

(54) METHOD AND DEVICE FOR ENCODING AND/OR DECODING A SEQUENCE OF DISCRETE SOURCE VALUES AND DATA CARRIER PROVIDED WITH AN ENCODED SEQUENCE OF SOURCE VALUES

(75) Inventor: Joost Lodewijk Karel Frans Bloemen, Maastricht (NL)

(73) Assignee: Exsilent Research B.V. (NL)

( * ) Notice: Subject to any disclaimer, the term of this patent is extended or adjusted under 35 U.S.C. 154(b) by 29 days.

(21) Appl. No.: 13/141,862

(22) PCT Filed: Dec. 24, 2009

(86) PCT No.: PCT/NL2009/050805
§ 371 (c)(1),
(2), (4) Date: Sep. 16, 2011

(87) PCT Pub. No.: WO2010/074579
PCT Pub. Date: Jul. 1, 2010

(65) Prior Publication Data
US 2011/0316727 A1  Dec. 29, 2011

(30) Foreign Application Priority Data
Dec. 24, 2008  (NL) ...................................... 2002377

(51) Int. Cl.
*H03M 7/30*  (2006.01)
(52) U.S. Cl.
USPC .............................................. 341/76; 341/77
(58) Field of Classification Search
USPC .............................................. 341/76, 77, 87
See application file for complete search history.

(56) References Cited

U.S. PATENT DOCUMENTS

| | | | | |
|---|---|---|---|---|
| 4,266,242 A | * | 5/1981 | McCoy | 348/588 |
| 4,821,290 A | * | 4/1989 | Hingorani et al. | 375/242 |
| 4,893,123 A | * | 1/1990 | Boisson | 341/143 |
| 4,939,749 A | * | 7/1990 | Zurcher | 375/249 |

OTHER PUBLICATIONS

The Search Report corresponding to the PCT/NL2009/050805 application.
Held G. "Data Compression; Techniques and Applications; Hardware and Software Considerations" Chichester, J.Wiley & Sons, GB, Jan. 1, 1983, pp. 49-51.
D. Salomon: "Data Compression, 3rd edition" 2004, Springer, pp. 24-25 ; 431-436.

* cited by examiner

*Primary Examiner* — Brian Young
(74) *Attorney, Agent, or Firm* — Kilpatrick Townsend & Stockton LLP

(57) ABSTRACT

In a method and device for encoding and/or decoding a sequence of discrete source values ($S_i$) sub-groups ($G_i$) of a number of successive source values are taken from the sequence of source values. The sub-groups of source values are encoded into packets, comprising in each case an initial value ($S_1$) corresponding to a first source value in a sub-group, a standardization factor (R) and difference values ($\Delta S_i$), standardized in accordance with the standardization factor, between values corresponding with other source values ($S_i$) in the sub-group and in each case a value corresponding with a preceding source value ($S_{i-1}$) in the sub-group. A standardization factor (R) is determined per packet subject to a greatest difference value ($\Delta_{max}$) within the sub-group between a source value and a preceding source value. The invention also relates to an information carrier provided with a thus encoded sequence of source values.

23 Claims, 2 Drawing Sheets

Figure 1A:
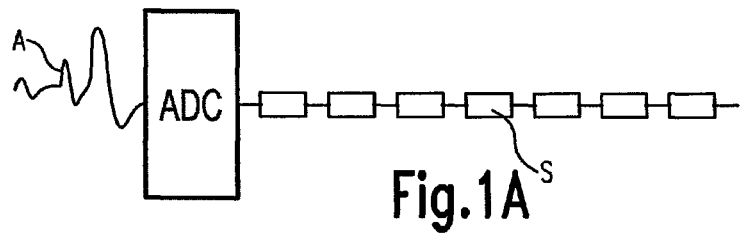

METHOD AND DEVICE FOR ENCODING AND/OR DECODING A SEQUENCE OF DISCRETE SOURCE VALUES AND DATA CARRIER PROVIDED WITH AN ENCODED SEQUENCE OF SOURCE VALUES

This application claims priority to and benefit under 35 U.S.C. §119 to International Application No. PCT/US2009/050805 filed Dec. 24, 2009 and to NL Application No.: 2002377 filed Dec. 24, 2008, the disclosures of which are herein expressly incorporated by reference in their entirety.

The present invention relates to a method and to a device for encoding a sequence of discrete source values. The invention also relates to a method and to a device for decoding a digital code. The invention moreover relates to a method for wireless or non-wireless transmission of a digital code, to a method for processing an analog signal and to a method for recording a digital code on a data carrier, and to a data carrier provided with a digital code.

A method of the above stated type is particularly suitable for discrete, particularly digital, signal processing, wherein an originally analog input signal has been or is converted to a digital representation thereof in the form of a sequence of discrete values. For this purpose the input signal is generally sampled periodically at a fixed sampling frequency and quantified to such a sequence of discrete source values, which is expressed in a digital code. Making use of a sufficiently high sampling frequency a faithful digital representation of the original signal can in this way be obtained, which can, if desired, be decoded back again and converted to the output signal, but meanwhile provides an ideal and robust form for digital signal processing, digital signal transfer and/or digital storage without any loss of signal-noise ratio. In order to be able here to efficiently manage available storage capacity or an available bandwidth, where wireless or non-wireless electronic transmission of the digital code is concerned, the digital code is preferably precompressed to a smaller format, making use of a suitable compression technique.

A distinction can be made here between compression techniques which allow an at least substantially perfect reproduction of the output signal and are therefore referred to as lossless, and so-called lossy techniques, wherein part of the original information is lost. These latter techniques generally achieve a higher compression factor and are applied for this reason on a large scale, for instance for audio and video compression. According to the chosen compression factor and sampling frequency however, this affects the quality of a reproduction of the input signal to a greater or lesser extent. A frequently used lossy standard for audio compression is for instance MP3, with which a digital audio code can be reduced to between a fifth and an eighth of its original format. The MPEG standard similarly provides a frequently applied lossy compression technique for video information.

These known compression techniques derive their compression factor particularly from the intelligent removal from the original material of information assumed not discernible by humans, or hardly so. Only the relevant information is retained. In accordance with the information content of the starting material, a considerable compression factor can thus be realized. A drawback however is that the thus removed information is permanently lost, i.e. it cannot be reproduced during a decompression of the code. For an above-average listener or viewer this results in a noticeable loss in quality, although this may also be perceived by a less experienced listener or viewer as a loss of clarity and dynamics.

In order to avoid such loss of quality it is also possible to resort to a lossless compression technique. Aside from quantifying errors, an original signal can hereby be recovered at least substantially exactly after decoding. A known lossless compression technique is for instance relative encoding of source values. This technique is for instance described by G. Held in "Data Compression. Techniques and Applications Hardware and Software Considerations, Chichester, J. Wiley & Sons, GB" of 1 Jan. 1983 on pages 49-51. According to this technique it is not the sequence of digital original source values itself which is transmitted, but their relative differences relative to their predecessor. This is provided that this difference remains within determined limits. The source value itself is otherwise nevertheless encoded, provided with a control bit in order to indicate this. This latter also immediately indicates a limitation of this encoding. If strong value fluctuations occur in the source values, this technique is more likely to result, when differences between successive values are too great, in an expansion instead of a compression of the amount of data, since such control bits must be added. The overall compression factor for the full quantity of data therefore remains limited.

The present invention has for its object, among others, to provide a method of the type stated in the preamble, with which a noticeable loss of quality after reproduction of the original signal can be limited to a significant extent, while a significant compression factor can nevertheless be realized.

In order to achieve the stated object, a method of the type described in the preamble has the feature according to the invention that sub-groups of a number of successive source values are taken from the sequence of source values, that the sub-groups of source values are encoded into packets, comprising in each case an initial value corresponding to a first source value in a sub-group, a standardization factor and difference values, standardized in accordance with the standardization factor, between values corresponding with other source values in the sub-group and in each case a value corresponding with a preceding source value in the sub-group, and that the standardization factor is determined per packet subject to a greatest difference value within the sub-group between a source value and a preceding source value. The invention is based here on the insight that, when the source values originate from a natural signal, such as particularly an audio or video signal, relative fluctuations between successive source values are generally limited, particularly in a limited sub-region around a source value.

By dividing the sequence of source values into sub-groups the maximum difference value can thus be limited to a relatively low value in the majority of the sub-groups, which can be translated into a relatively high resolution of the difference values in the sub-group relative to each other when expressed in a digital code with a fixed word length. In these sub-groups a faithful reproduction of such a signal is possible, at least to a significant degree, while it is nevertheless possible to save on word length. This results in a compression factor in the encoding which at least approximates the compression factor of the above described known lossy compression techniques, without suffering to the same extent from the loss of quality associated with these known techniques. Only in the sub-groups in which there is a great dynamic between successive source values, and so a corresponding maximum difference value, is it necessary to compromise on the resolution and precision of the coding. This is thus limited however to only these subgroups and is independent of other sub-groups or data packets in which a greater precision can be maintained. All in all, the reproduction of the natural input signal as a whole does not therefore have to be noticeably affected, or hardly so.

The method according to the invention moreover provides the option of shifting the hereby introduced encoding-decoding errors to the higher part of the spectrum and of reducing them by applying an emphasis and de-emphasis process thereon. All in all, this provides a substantial improvement in the quality of the reproduction of the signal compared to the above stated known lossy compression techniques, while a high compression factor can nevertheless be maintained. Owing to the invention considerably less computing capacity, and so less processor power, is moreover required for this purpose than is the case in known lossless techniques, so that the method according to the invention is also particularly suitable for applications in which only a limited processor capacity and/or electronic power supply capacity is available or can be made available.

The difference values can per se be derived directly from the source values. A preferred embodiment of the method according to the invention has the feature however that a decoded value of the encoded preceding source value is used for the value of the preceding source value. By thus making use of a decoded source value, at least partial compensation is made for rounding-off differences which can occur in the encoding. This will eventually result in a more faithful reproduction of the sequence of source values as can then be obtained through decoding.

In a particular embodiment the method according to the invention has the feature that the standardization factor is determined from a quotient of the greatest difference value of an original source value relative to a preceding original source value within the sub-group and a predetermined resolution factor. The difference values encoded in accordance with the invention can be obtained here from a simple quotient of the original difference value and this standardization factor. The precision of the encoding increases here as the resolution factor increases, although this is to the detriment of the compression factor which can be achieved, and can be set therebetween as desired in a specific field of application. In the case of a binary coding as usually applied in digital signal and data processing, a further particular embodiment of the method according to the invention has in this respect the feature that the difference values are brought into binary form with a fixed word length and that the resolution factor is equal to two to the power of said word length minus one.

A further preferred embodiment of the method according to the invention has the feature that an error value is determined from a difference between the source value and a decoded value of the encoded source value, that the error value is added to a preceding error value in the sub-group and that a subsequent initial value is adjusted on the basis of the thus progressive sum of the error values within the sub-group. Direct use is thus not made of the source values, but allowance is made here for the progressive sum of encoding errors within the relevant sub-group. At least partial compensation is hereby made beforehand for encoding errors and quantization noise, whereby the eventually obtained code will more closely approximate the source values.

It has been found that, when compression remains the same, the quality of a reproduction of an audio signal can be improved by modifying to some extent the differences between successive source values by applying a so-called emphasis filter. A further preferred embodiment of the method according to the invention has for this purpose the feature that a difference value of a source value is multiplied uniformly by a preceding source value, particularly by multiplication by a fixed amplification factor, more particularly an amplification factor between about two and three. High-frequency components in the signal are thus amplified more than low-frequency components. The amplification factor applied here determines the degree and the gradualness with which this difference in amplification is expressed, and lies typically between a value of 2 and 3, wherein a transition point lies typically in the range of 8-10 kHz. Because encoding noise will occur particularly in this higher part of the frequency range, the influence thereof on the quality of the coding can be reduced by performing a reverse attenuation with a complementary de-emphasis filter during the decoding. By applying a complementary de-emphasis it is possible afterward during a decoding of the code to compensate for the thus previously performed frequency-dependent modification.

The present invention is widely applicable, particularly for digital audio and video compression. In this respect a method for recording a digital code, comprising a sequence of successive discrete source values ($S_i$) has the feature according to the invention that the source values are encoded into packets with the method according to one or more of the foregoing claims, and that the packets are recorded on a suitable electronic data carrier. Owing to the invention for storage of the sequence of source values it is thus possible to save on storage capacity while retaining an at least significant measure of sound and/or image quality, whereby the information carrier can hold more information. The invention also relates to a thus at least partially filled information carrier, characterized by a recording of a digital code comprising a sequence of successive discrete source values in the form of packets of in each case an initial value corresponding to a first source value, a standardization factor and difference values standardized in accordance with the standardization factor, between values corresponding with subsequent other source values and a value corresponding to a preceding source value.

A method for wireless or non-wireless transmission of a digital code comprising a sequence of successive discrete source values has the feature according to the invention that the source values are encoded into packets with the method according to one or more of the foregoing claims, and that the packets are exchanged with a medium for electronic signal transfer, in particular wireless signal transfer. Owing to the data compression based thereon, usually without essential loss of quality, the size of the data flow can in this case also be reduced, and more efficient use can thereby be made of a bandwidth available in the signal transfer.

The invention can advantageously also be applied for an analog to digital conversion of an analog electronic output signal. For this purpose a method for processing an analog signal, in particular an audio signal, wherein the signal is sampled at a regular interval in order to obtain a sequence of successive discrete sample values, has the feature according to the invention that the sequence of sample values is encoded using an embodiment of the above described method according to the invention.

In order to enable a subsequent faithful reproduction of the output information, the invention also provides a method for decoding a digital code, comprising a sequence of successive discrete source values which have been encoded according to the present invention into packets of in each case an initial value, a standardization factor and successive difference values standardized in accordance with the standardization factor. Such a method here has the feature according to the invention that the difference values are multiplied by at least the standardization factor in order to obtain absolute difference values, and that an output value is obtained from a progressive sum of the initial value and successive absolute difference values.

It is otherwise noted that, where reference is made in the present application to a product, i.e. multiplication, this must also be understood to mean a division with a reciprocal value, and vice versa. Within the scope of the present invention sum is likewise understood to mean a difference with a corresponding value of opposite sign, and vice versa.

A particular embodiment of the decoding method according to the invention has the feature that the absolute difference values are obtained from a product of the difference values with at least the standardization factor and a reciprocal amplification factor. An attenuation is thus performed on the individual difference values in order to thereby compensate in a given case for a corresponding amplification applied during the encoding.

A device for encoding a sequence of discrete source values is characterized according to the invention by storage means for at least temporarily storing a sub-group of successive source values from the sequence, by difference means for obtaining difference values of source values relative to respective preceding source values, by processor means for obtaining a maximum difference value of the difference values and by encoding means for forming code fragments comprising an initial value corresponding to a first source value, a standardization factor in accordance with the maximum difference value and successive difference values standardized in relation to the standardization factor.

A device for decoding a digital code with at least one code fragment, comprising an initial value, a standardization factor and successive difference values, is characterized according to the invention by multiplying means for multiplying the difference values by the standardization factor, and by adding means for holding and generating a progressive sum of the multiplied difference values with the initial value.

Figure 1B:
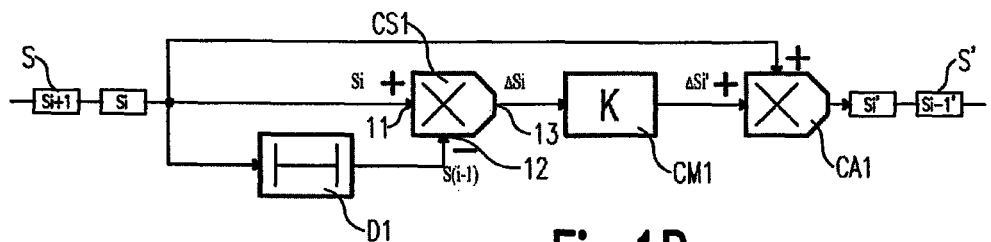
Figure 1C:
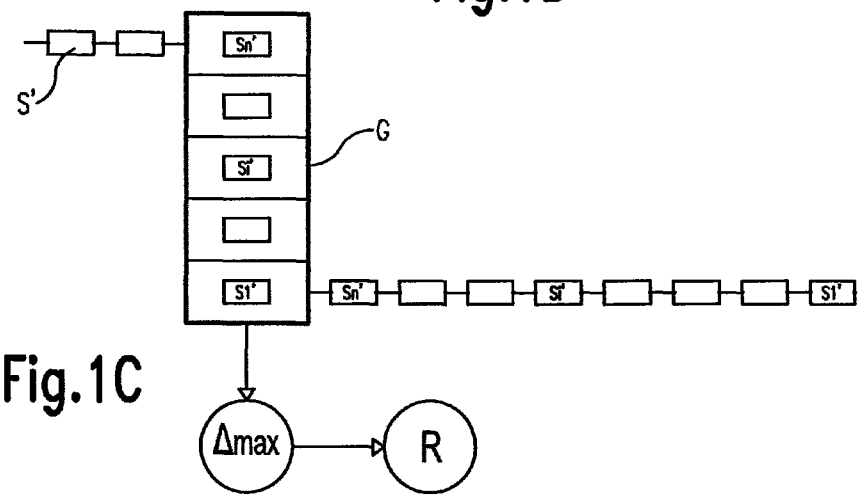
Figure 1D:
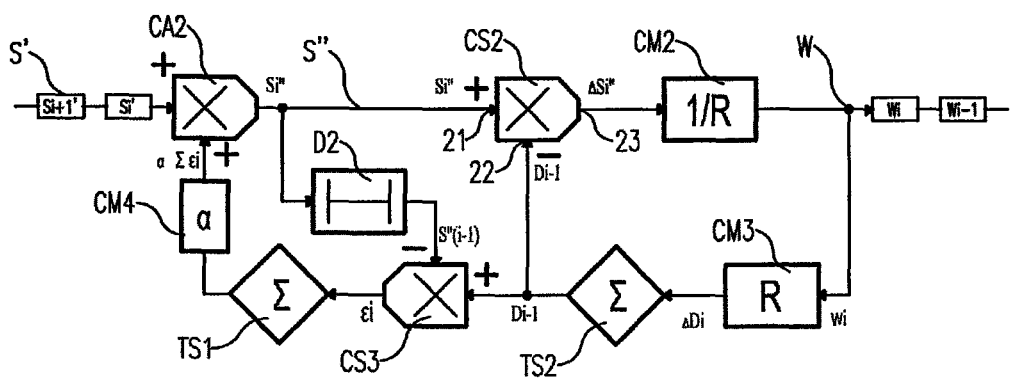
Figure 1E:
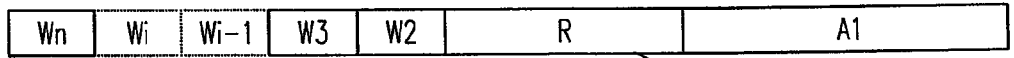
Figure 2A:
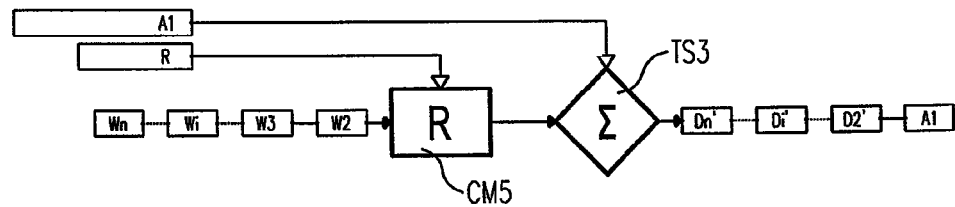
Figure 2B:
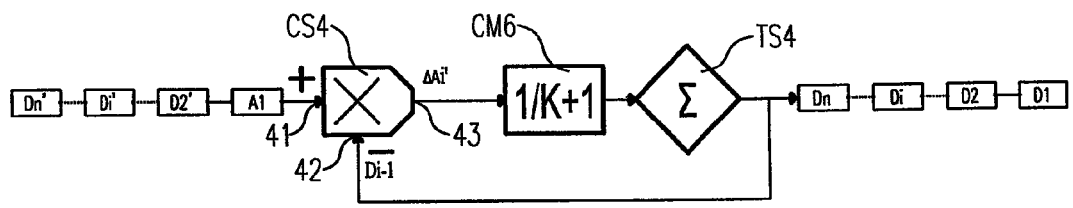
Figure 2C:
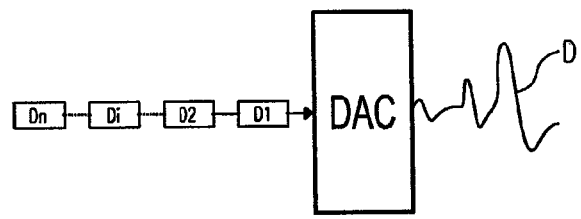

The invention will now be further elucidated on the basis of an exemplary embodiment and an associated drawing. In the drawing:

FIGS. 1A-1E show a schematic representation of an embodiment of a device and method for encoding a digital code according to the invention; and FIGS. 2A-2C show a schematic representation of an embodiment of a device and method for decoding a digital code according to the invention.

The figures are purely schematic here and not drawn to scale. Some dimensions in particular may be exaggerated to a greater or lesser extent for the sake of clarity. Corresponding components are designated as far as possible in the figures with the same reference numeral.

In components A-E FIG. 1 shows successive stages in a processing of an analog input signal A in accordance with an exemplary embodiment of a method according to the invention. Use is made in this example of an audio signal as input signal, although the invention is equally suitable for for instance a video signal, image information and other types of source signal. In a first stage, see FIG. 1A, a sequence S of discrete values is formed from the source signal. For this purpose signal A is fed to an S analog-digital converter ADC which samples the analog input signal A at a sampling frequency which is sufficient to subsequently enable a qualitatively satisfactory reproduction of the signal and is therefore set at about double the highest frequency component in the input signal. Assuming a highest audio frequency to be reproduced of roughly 16 kHz, in this example use is made in this respect of a sampling frequency of 32 kHz. The samples of input signal A thus taken at a regular time interval of about 31 milliseconds are quantified in usual manner and digitized to form successive discrete source values. Use is made in this embodiment of a word length equal to 16 for the source values, although use can also be made of a shorter or longer word length within the scope of the invention.

A signal improvement is applied to the source values by conducting the source values through a so-called emphasis filter. An example of such a filter suitable within the scope of the invention is shown in FIG. 1B. The filter comprises difference means CS1 with a positive input 11 to which a source value $S_i$ is provided and a negative input 12 which is coupled to an output of delay means DI from which the preceding source value $S_{i-1}$ is taken. The difference means Si supply to an output 13 the difference value $\Delta S_i$ between the two values. This value is presented to multiplying means CM1, which perform a multiplication by a predetermined amplification factor K in order to emphasize the difference. The thus increased difference value $\Delta S_i'$ is finally thus added to the preceding value by means of adding means CA1 provided for this purpose in order to obtain a thus pronounced source value $S_i'$.

High-frequency components in the signal are thus amplified more than low-frequency components. The amplification factor K here determines the extent and the graduality with which this difference in amplification is expressed, and lies typically between a value of 2 and 3, wherein a transition point lies typically in the range of 8-10 kHz.

Because encoding noise will occur particularly in this higher part of the frequency range, the influence thereof on the quality of the coding will be reduced by performing a reverse attenuation with a complementary de-emphasis filter during the decoding.

In accordance with the invention, sub-groups of an optionally constant predetermined number (n) of source values, which will together be encoded to form a packet, are taken from the thus amplified source values $S_i'$. In this example use will be made of sub-groups with a fixed size of n=18 source values, although this number can be set higher or lower as desired within the scope of the invention, and moreover vary in some cases from sub-group to sub-group. A thus taken sub-group $S_1' \ldots S_n'$ of source values is temporarily stored in a register G and analysed, see FIG. 1C. A maximum difference $\Delta_{max}$ is here determined from the mutual value differences between successive values ($S_i'$, $S_{i-1}'$). A standardization factor R is determined or derived herefrom, which will be used for scaling in the subsequent coding of the sub-group of source values $S_1 \ldots S_n$ to a digital code packet.

In this example the standardization factor R is determined from the quotient of the maximum difference value $\Delta_{max}$ and a resolution factor (N). On the basis of a word length (WL) in the final encoding of the difference values, this resolution factor (N) amounts in this example to two to the power of the word length (WL) decreased by one, or $N=2^{(WL-1)}$. In the coding one bit thus remains available for the sign of the encoded value. The resolution factor is moreover corrected for quantization noise by multiplication by a factor $(1+1/WL^2)$, so that:

$$R=(1+1/WL^2).\Delta_{max}/2^{(WL-1)}.$$

In this example, wherein use is made of an encoding of the difference values into four-bit words, so WL=4, it is thus the case for R that:

$$R=(1+1/16).\Delta_{max}/8=\Delta_{max}.17/128.$$

The thus determined resolution factor R is rounded off and processed to a binary code with the same word length as the source values S, or a shorter word length, as in this example, wherein use is made of twelve bits for the resolution factor (R). It is otherwise noted that, instead of a suchlike or similar mathematical derivative, the resolution factor (R) can also be obtained in other manner on the basis of the maximum difference value $\Delta_{max}$, for instance by selection from a predefined table of values.

The source values S' are then encoded sub-groupwise according to the invention into packets with successive values corresponding to the first source value $S_1$, the resolution factor (R) and difference values $W_2 \ldots W_n$ of a source value relative to a preceding source value, standardized in accordance with the resolution factor. In this example use is made for the initial value ($S_1$) and the resolution factor (R) of a word length of respectively sixteen and twelve, although the difference values are compressed to binary words with a significantly shorter word length WL. In this example the difference values ($W_2 \ldots W_n$) are in this respect encoded in 4 bits, wherein one bit is used for the sign of the represented value. It has been found that, by thus applying a resolution factor (R) in sub-groupwise manner, a high-quality signal reproduction can nevertheless be achieved despite a relatively strong compression.

For the purpose of determining said difference values $W_2 \ldots W_n$ the source values ($S_2' \ldots S_n'$) are processed by an encoding device according to the invention, for instance as shown in FIG. 1D. A presented source value $S_i'$ is here first increased by a progressive sum ($\Sigma\epsilon_i$) of the total encoding errors within the sub-group, in this example multiplied by a fixed factor $\alpha$, typically lying around a value of $\alpha=1.5$. The factor $\alpha$ can be static as well as dynamic and be the same or different per case.

The progressive sum ($\Sigma\epsilon_i$) is initially set to zero for each sub-group and will fluctuate around this value on the basis of individual, positive and negative encoding errors which occur during the encoding. Surprisingly, it has been found that such generally unavoidable encoding errors thus level out to a certain extent in the result of the encoding, which is thereby more robust and allows more exact reproduction of the original source values.

The thus modified source value $S_i''$ is supplied to positive input 21 of further difference means CS2. To a negative input 22 thereof the decoded value $D_{i-1}''$ is supplied instead of the preceding source value $S_{i-1}''$ in order to thereby anticipate a later decoding of the obtained value and to further limit a deviation herein relative to the original value. At an output a difference value $\Delta S_i''$ is thus taken, this value corresponding, albeit in a multi-modified form, to a difference in the original source value $S_i$ with its predecessor $S_{i-1}$ in the sub-group. This difference value is then encoded by multiplication by the reciprocal standardization factor R, or division by R, for which purpose further multiplying means CM2 are provided. The thus standardized difference value is binary coded to three bits, wherein a fourth bit is reserved for the sign. Binary words $W_i$ with a word length WL of four bits are thus obtained for the purpose of representing the difference values $\Delta S_i''$.

An encoded value $D_{i-1}$ is obtained by multiplying this difference value by the applied standardization factor R using further multiplying means CM3 provided for this purpose and by keeping track, with accumulating means TS2 provided for this purpose, of a progressive total of values thus calculated back. This value is supplied to the negative input 22 of the second difference means CS2 and is also compared by means of third difference means CS3 provided for this purpose to the associated original, uncoded value $S_{i-1}''$ which is taken at an output of delay means D2. The result of this comparison represents the individual coding error that has occurred in the source value $S_i''$, which is supplied to the input of a further accumulator TS1 which thus records and generates the progressive sum ($\Sigma\epsilon_i$) thereof as output value to multiplying means CM4 for the purpose of multiplying said sum by the above stated factor $\alpha$, typically of around $\alpha=1.5$. The thus obtained product ($\alpha.\Sigma\epsilon_i$) of the progressive sum $\Sigma\epsilon_i$ is supplied to a second input of the second adding means CA2 in order to add this value to a subsequent source value.

As shown schematically in FIG. 1E, packets are thus created sub-groupwise from original source values $S_1 \ldots S_n$ of successively an initial value $A_1$ corresponding to a first source value $S_1$ in the sub-group, the standardization factor R calculated or otherwise determined per sub-group, and of successive difference values $W_2 \ldots W_n$, which correspond to differences in value between successive source values $S_2 \ldots S_n$ relative to their predecessor in the sub-group. The size of the sub-group and a word length of the difference values can be set here as desired, taking into account for instance the dynamics of the input signal, a desired compression factor and a maximum allowable latency in a reproduction of the signal.

Use is made in this example of sub-groups of in each case n=18 source values, which are thus compressed from $18\times16=288$ bits to $16+12+17\times4=96$ bits, or a compression factor of three, with hardly any audible loss of detail. By adding more source values to the sub-group the compression factor can be increased in order to finally approach a factor of four. The word length of the difference values in particular can also be made shorter in order to amplify the compression or, conversely, longer in order to increase the accuracy of the encoding. In addition, the multiplication factor K of the applied emphasis filter can be modified so as to be able to eventually achieve an optimal result on the basis of this parameter, which can be adjusted in a specific case.

The thus obtained code W, see FIG. 1E, can if desired be stored according to the invention on an electronically readable digital information carrier, such as an electronic memory or an optical disc, wherein storage space is saved owing to the compression applied therein. In addition, the packet code W can be exchanged via an optionally wired transmission medium with electronic means for digital data transfer, wherein the required bandwidth is limited owing to the same compression factor. A conventional lossless compression can optionally also be applied in order to realize a further reduction in required storage space or bandwidth.

In order to finally be able to reproduce the input signal, decoding means are provided according to the invention, an exemplary embodiment of which is shown schematically in FIG. 2A. These means are able to respectively isolate the initial value $A_1$ and the stabilization factor R from a packet code and feed them to an accumulator TS3 and product means CMS. The accumulator records a progressive sum of the values supplied thereto which can be taken at an output thereof. For each new packet code the accumulator TS3 is set to zero so that the first value appearing at the output will be the initial value $S_1'$. The standardized difference values $W_i$ from the packet are successively conducted through product means CM5, which are provided to multiply the relevant values by the respective standardization factor R in order to calculate decoded difference values $\Delta D_i'$ therefrom. This value is added to accumulator TS3, which generates the associated decoded source value $D_1' \ldots D_n'$ as a progressive sum. A sequence of decoded source values $D_1' \ldots D_n'$ is thus obtained, in which correction has not yet been made for the initially applied emphasis filter of FIG. 1B.

With a view to this latter, the obtained decoded source values $D_1' \ldots D_n'$ are conducted through a de-emphasis filter of FIG. 2B, which is complementary to the emphasis filter of FIG. 1B. The filter of FIG. 2B successively comprises difference means CS4, multiplying means CM5 and an accumulator TS4, an output of which is fed back to a negative input 42 of the difference means CS4. The decoded source values $D_1' \ldots D_n'$ are supplied to positive input 41 thereof, so that a difference $\Delta D_i$ from the accumulated sum of accumulator TS4 appears at an output 43. The multiplying means CM6 apply a multiplication by a factor $1/(K+1)$, i.e. the reciprocal value of the amplification factor increased by one, on this difference value $\Delta D_i$. At the output of the filter the decoded source values $D_1' \ldots D_n'$ can then be taken as reproduction of the original source values $S_1 \ldots S_n$.

If desired, the thus decoded source values $D_1 \ldots D_n$ can be converted to a reproduction D of the original analog audio signal A using a digital to analog converter DAC, see FIG. 2C.

Although the invention has been further elucidated above on the basis of only a single embodiment, it will be apparent that the invention is by no means limited thereto. On the contrary, many variations and embodiments are still possible within the scope of the invention for a person with ordinary skill in the art.

The invention claimed is:

1. A method for encoding a sequence of discrete source values ($S_i$) comprising the steps of:
   creating sub-groups ($G_j$) of a number of successive source values from the sequence of source values;
   encoding the sub-groups of source values by a microprocessor into packets, each sub-group comprising an initial value ($S_1$) corresponding to a first source value in a sub-group, a standardization factor (R) and difference values ($\Delta S_i$), and
   standardizing the difference values ($\Delta S_i$) in accordance with the standardization factor, between values corresponding with other source values ($S_i$) in the sub-group and in each case a value corresponding with a preceding source value ($S_{i-1}$) in the sub-group, such that the standardization factor is determined per packet subject to a greatest difference value ($\Delta_{max}$) within the sub-group between a source value and a preceding source value.

2. Method as claimed in claim 1, further comprising using a decoded value ($S_i'$) of an encoded preceding source value ($A_{,i}$) for the value of the preceding source value.

3. Method as claimed in claim 1, wherein the standardization factor (R) is determined from a quotient ($\Delta_{max}/N$) of the greatest difference value of an original source value ($S_i$) relative to a preceding original source value ($S_{i-1}$) within the sub-group ($\Delta_{max}$) and a predetermined resolution factor (N).

4. Method as claimed in claim 3, wherein the difference values are brought into binary form with a fixed word length (WL) and the resolution factor (N) is equal to two to the power of said word length minus one ($2^{WL-1}$).

5. Method as claimed in claim 4, further comprising applying to the standardization factor a product with a factor $(1+1/WL^2)$.

6. Method as claimed in claim 1, further comprising determining an error value ($\epsilon_i$) from a difference between the source value ($S_i$) and a decoded value of an encoded source value ($A_i$), wherein the error value is added to a preceding error value ($\epsilon_{i-1}$) in the sub-group and wherein a subsequent initial value ($S_i$) is adjusted on the basis of the thus progressive sum ($\Sigma_G$) of the error values within the sub-group.

7. Method as claimed in claim 1, further comprising increasing a difference value ($\Delta S_i$) of a source value ($S_i$) by a preceding source value ($S_{i-1}$).

8. Method for recording a digital code, comprising encoding a sequence of successive discrete source values ($S_i$) by a microprocessor into packets according to the method of claim 1, and recording the packets on a suitable electronic information carrier.

9. Method for wireless or non-wireless transmission of a digital code comprising encoding a sequence of successive discrete source values ($S_i$) by a microprocessor into packets according to the method of claim 1, and exchanging the packets with a medium for electronic signal transfer.

10. Method for processing an analog signal (A) comprising, sampling the signal at a regular interval in order to obtain a sequence of successive discrete sample values ($S_i$), and encoding the sequence of sample values by a microprocessor according to the method of claim 1.

11. Method for decoding a digital code, comprising encoding a sequence of successive discrete source values ($S_i$) according to the method of claim 1 into packets of an initial value ($S_1$) corresponding to an initial first source value, a standardization factor (R) and difference values standardized in accordance with the standardization factor, wherein the difference values are multiplied by a microprocessor by at least the standardization factor in order to obtain absolute difference values, and an output value is obtained from a progressive sum of the initial value and successive absolute difference values.

12. Method as claimed in claim 11, further comprising obtaining the absolute difference values from a product of the difference values and at least the standardization factor and a reciprocal amplification factor.

13. Method as claimed in claim 11, further comprising multiplying the initial value by the standardization factor.

14. Device for encoding a sequence of discrete source values ($S_i$) comprising:
   storage means for at least temporarily storing a sub-group of successive source values from the sequence;
   difference means for obtaining difference values ($\Delta S_i''$) of source values ($S_i''$) relative to respective preceding source values ($S_{i-1}''$);
   processor means for obtaining a maximum difference value ($\Delta_{max}$) of the difference values; and
   encoding means for forming code fragments including an initial value ($A_i$) corresponding to a first source value ($S_i$), a standardization factor (R) in accordance with the maximum difference value ($\Delta_{max}$), and successive difference values ($W_i$) standardized in relation to the standardization factor.

15. Device as claimed in claim 14, further comprising multiplying means for multiplying obtained difference values by a standardization factor.

16. Device as claimed in claim 14, further comprising accumulation means for determining and generating per sub-group a progressive sum of encoding errors which have occurred in the sub-group, and wherein an output thereof is coupled to adding means which add the progressive sum to a subsequent source value.

17. Device as claimed in claim 14, further comprising decoding means for decoding a standardized difference value to a calculated source value, difference means for determining an error value from a comparison of the calculated source value with an associated original source value, and adding means for holding a progressive sum of the error values in each sub-group and to add said sum to a source value.

18. Device for decoding a digital code with at least one code fragment including an initial value, a standardization factor and successive difference values,-comprising:
   multiplying means for multiplying the difference values by the standardization factor;
   adding means for holding and generating a progressive sum of the multiplied difference values with the initial value; and dividing means for obtaining a quotient between the difference values and a predetermined amplification factor.

19. The method of claim 7, wherein the difference value ($\Delta S_i$) of the source value ($S_i$) is increased by a preceding source value ($S_{i-1}$) by multiplication by a fixed amplification factor (K).

20. The method of claim 19, wherein the amplification factor (K) is between about two and three.

21. The method of claim 9, wherein the medium for electronic signal transfer comprises a wireless signal transfer.

22. The method of claim 10, wherein the signal comprises an audio signal.

23. The device of claim 16, wherein the progressive sum that is added to the subsequent source value is in multiplied form.

* * * * *